(12) United States Patent
Kronenberg et al.

(10) Patent No.: US 6,646,622 B1
(45) Date of Patent: Nov. 11, 2003

(54) COMBINATION INSTRUMENT

(75) Inventors: Hartmut Kronenberg, Butjadingen (DE); Ernst-Ulrich Simon, Oberursel (DE)

(73) Assignee: Mannesmann VDO AG, Frankfurt (DE)

( * ) Notice: Subject to any disclaimer, the term of this patent is extended or adjusted under 35 U.S.C. 154(b) by 189 days.

(21) Appl. No.: 09/644,963

(22) Filed: Aug. 23, 2000

(30) Foreign Application Priority Data

Aug. 31, 1999 (DE) .......................... 199 41 352

(51) Int. Cl.⁷ .............................. G09G 5/00; G01P 5/00
(52) U.S. Cl. ........................................ 345/1.1; 116/62.4
(58) Field of Search .......................... 345/1.1; 382/29, 382/489; 116/62.1, 62.4; 340/441; 73/493, 496; 361/749; B60K 35/00

(56) References Cited

U.S. PATENT DOCUMENTS

| | | | | |
|---|---|---|---|---|
| 4,191,441 A | * | 3/1980 | Ryder et al. ................ 361/749 |
| 5,003,433 A | * | 3/1991 | Fournier ..................... 116/286 |
| 5,008,496 A | * | 4/1991 | Schmidt et al. ............. 174/254 |
| 5,959,844 A | * | 9/1999 | Simon et al. ............... 307/10.1 |
| 6,409,355 B1 | * | 6/2002 | Simon et al. ................. 362/23 |

FOREIGN PATENT DOCUMENTS

| | | | |
|---|---|---|---|
| DE | 1978006 | 2/1968 | |
| DE | 4240456 | 7/1994 | |
| DE | 4244452 | 7/1994 | |
| DE | 4339909 | 3/1995 | |
| JP | 03-011786 | * 1/1991 | ............ H05K/1/02 |
| JP | 10-003759 | * 1/1998 | ............ G11B/21/02 |
| WO | WO 95/16921 | * 6/1995 | ............ G01P/1/02 |

* cited by examiner

Primary Examiner—Richard Hjerpe
Assistant Examiner—Alexander Eisen
(74) Attorney, Agent, or Firm—Martin A. Farber

(57) ABSTRACT

A combination instrument has a base body (9) which is split into display areas oriented at different angles relative to one another. An additional printed circuit (1) extending over a plurality of display areas is arranged on the front of the base body (9). This additional printed circuit comprises rigid printed circuit parts (2, 3, 4) which have flexible connecting regions (5, 6) with conductor tracks in the junction region of the display areas.

10 Claims, 1 Drawing Sheet

COMBINATION INSTRUMENT

FIELD AND BACKGROUND OF THE INVENTION

The invention relates to a combination instrument having a base body which is split into display areas oriented at different angles relative to one another, and having a rigid main printed circuit on the back of the base body.

Combination instruments of the above type are present in motor vehicles today and are therefore widely known. The different orientation of the display areas usually serves to improve the readability of the displays, as a result of the display areas being oriented toward the driver. Such combination instruments result in difficulties caused by the electrical connection of the individual instruments and of the electrical and electronic components. In practice, each display area has a separate printed circuit oriented parallel to the respective plane of the display area so that a instruments, for example, can be arranged on it at the desired angular orientation. The arrangement of a plurality of separate printed circuits gives rise to undesirably high costs.

SUMMARY OF THE INVENTION

The invention is based on the problem of designing a combination instrument of the type mentioned in the introduction such that it can be manufactured as economically as possible despite the arrangement of differently oriented display areas.

The invention solves this problem by means of the feature that an additional printed circuit extending over a plurality of display areas is arranged on the front of the base body, and that the additional printed circuit comprises rigid printed circuit parts which have flexible connecting regions with conductor tracks in the junction region of the display areas.

This structure allows a single printed circuit to be used for the various display areas, by this printed circuit being bent in its connecting regions according to the different orientation of the display areas. Since the connecting regions have conductor tracks, they do not need to be electrically connected to one another in additional processes after the printed circuit has been fitted. In addition to this is the fact that handling only a single printed circuit for a plurality of display areas instead of separate printed circuits for each display area represents a major simplification.

The flexible connecting regions can be produced particularly economically if they are formed by a reduction in the thickness of the printed circuit in the connecting regions.

If a particularly high level of flexibility is required and different distances between the connecting regions on account of wide manufacturing tolerances need to be compensated for, then another development of the invention allows provision for the connecting regions to be formed by u-shaped portions.

The additional printed circuit can be held on the base body without separate attachment means if instruments and light boxes attached to the base body are mounted on the additional printed circuit.

The base body can be matched to different physical circumstances if, in accordance with another development of the invention, the display areas on the base body are connected to one another by flexible connecting pieces.

A particularly high level of flexibility for the connecting pieces is achieved if the connecting pieces are of unshaped design transversely with respect to the plane of the display areas.

BRIEF DESCRIPTION OF THE DRAWING

The invention allows various embodiments. To clarify its basic principle further, one of these is shown systematically in the figures of the drawing and is described below. In the figures of the drawing.

DETAILED DESCRIPTION OF PREFERRED EMBODIMENT

Figure 1:
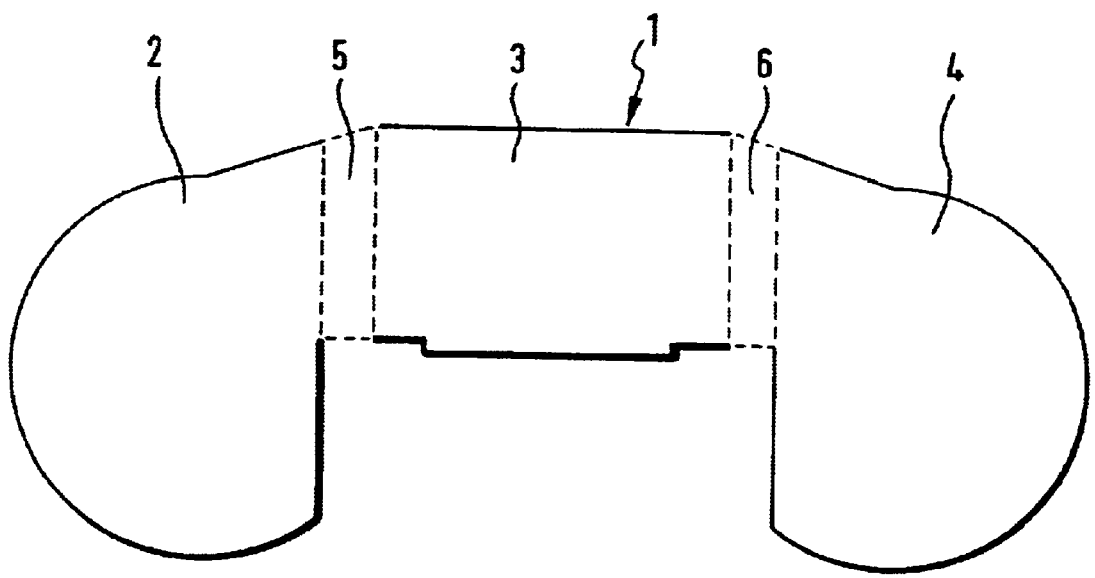
FIG. 1 shows a front view of a printed circuit designed in accordance with the invention.

FIG. 1 shows a printed circuit 1 comprising three rigid printed circuit parts 2, 3, 4 which are connected to one another by flexible connecting regions 5, 6. As FIG. 2 reveals, these flexible connecting regions 5, 6 may be formed by milled-out areas 7, 8, that is to say by reducing the thickness of the printed circuit 1 in the connecting regions 5, 6. However, it is also possible for the connecting regions 5, 6 to be formed by sections running in a u-shape, and electrical conductor tracks running over the connecting regions 5, 6 in all cases so that the printed circuit parts 2, 3, 4 are electrically connected to one another.

Figure 2:
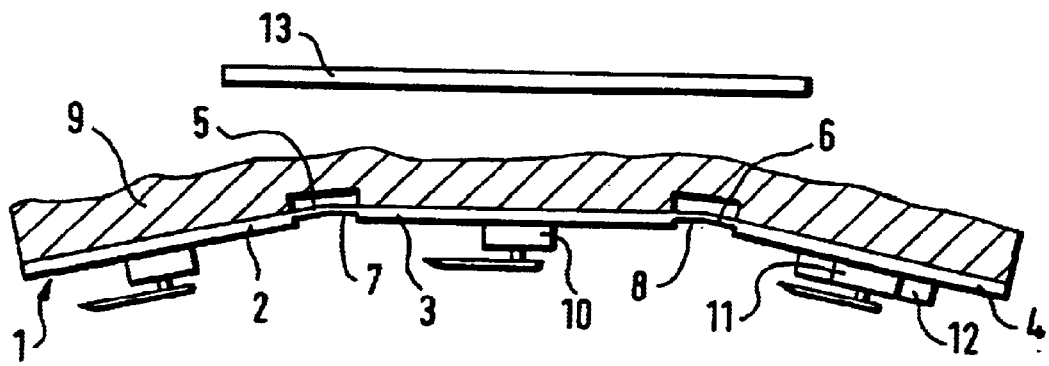
FIG. 2 shows a subregion of a combination instrument according to the invention.

FIG. 2 shows a subregion of a base body 9, on whose front face the printed circuit 1 rests. Instruments 10, 11 or light boxes 12 are seated on the printed circuit 1 from the front and are fixed on the base body 9 in a customary manner (not shown), so that the instruments 10, 11 and/or light boxes 12 hold the printed circuit 1 on the base body 9. Behind the back of the base body 9, a rigid main printed circuit 13 is visible, which carries those components which are not meant to be attached to the printed circuit 1.

Figure 3:
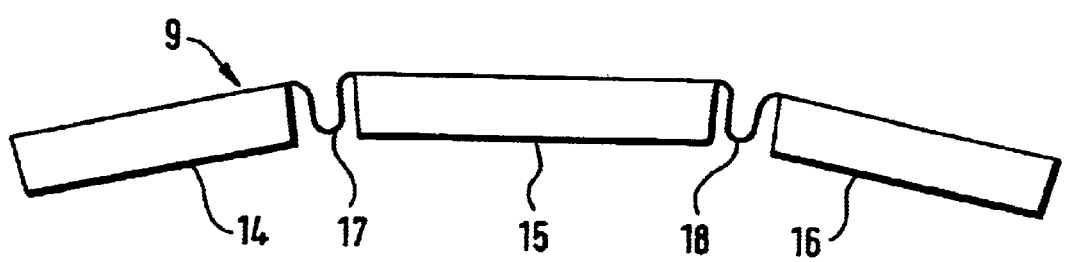
FIG. 3 shows a plan view of a base body of the combination instrument.

FIG. 3 shows a base body 9 with three display areas 14, 15, 16 which run at a different angular orientation and which are connected to one another flexibly by u-shaped connecting pieces 17, 18 in each case.

We claim:

1. A combination instrument comprising a base body which is split into display areas oriented at different angles relative to one another, and a rigid main printed circuit on a back of the base body, an additional printed circuit (1) extending over a plurality of said display areas (14, 15, 16) is arranged on a front of the base body (9), and wherein said additional printed circuit (1) comprises rigid printed circuit parts (2, 3, 4) which have flexible connecting regions (5, 6) therebetween maintaining the rigid printed circuit parts oriented at different angles from one another the flexible connecting regions having conductor tracks in a junction region of the display areas (14, 15, 16).

2. The combination instrument as claimed in claim 1, wherein said flexible connecting regions (5, 6) are formed by a reduction in thickness of the printed circuit (1) in the connecting regions (5, 6).

3. The combination instrument as claimed in claim 1, wherein connecting regions (5, 6) are formed by u-shaped sections.

4. The combination instrument as claimed in claim 1, wherein instruments (10, 11) and light boxes (12) attached to the base body (9) are mounted on the additional printed circuit (1).

5. The combination instrument as claimed in claim 1, wherein the display areas (14, 15, 16) on the base body (9) are connected to One a another by flexible connecting pieces (17, 18).

6. The combination instrument as claimed in claim 5, wherein said connecting pieces (17, 18) are of u-shaped design transversely with respect to a plane of the display areas (14, 15, 16).

7. The combination instrument as claimed in claim 1, wherein behind said flexible connecting regions, said base body In recessed.

8. The combination instrument as claimed in claim 7, wherein said flexible connecting regions are milled out.

9. The combination instrument as claimed in claim 1, wherein said flexible connecting regions are milled out.

10. A combination instrument comprising a base body which is split into display areas oriented at different angles relative to one another, and a rigid main printed circuit on a back of the base body, an additional printed circuit (1) extending over a plurality of said display areas (14, 15, 16) is arranged on a front of the base body (9), and wherein said additional printed circuit (1) comprises rigid printed circuit parts (2, 3, 4) which have flexible connecting regions (5, 6) therebetween maintaining the rigid printed circuit parts oriented at different angles from one another, the flexible connecting regions having conductor tracks in a junction region of the display areas (14, 15, 16), wherein instruments (10, 11) and light boxes (12) attached to the base body (9) are mounted on the additional printed circuit (1).

* * * * *